United States Patent [19]

Newcomb

[11] 4,359,650
[45] Nov. 16, 1982

[54] HIGH VOLTAGE DRIVER AMPLIFIER APPARATUS

[75] Inventor: Robert E. Newcomb, Nashua, N.H.

[73] Assignee: The United States of America as represented by the Secretary of the Air Force, Washington, D.C.

[21] Appl. No.: 206,415

[22] Filed: Nov. 13, 1980

[51] Int. Cl.³ .................. H03K 3/26; H03K 5/153
[52] U.S. Cl. ............................. 307/270; 307/254; 307/350; 307/359; 331/111
[58] Field of Search ............... 307/270, 254, 358, 359, 307/350

[56] References Cited

U.S. PATENT DOCUMENTS

| | | | |
|---|---|---|---|
| 3,947,776 | 3/1976 | Stevens et al. | 307/270 |
| 3,989,958 | 11/1976 | Renirie et al. | 307/491 |
| 4,207,534 | 6/1980 | Miille | 307/359 |
| 4,210,826 | 7/1980 | Baker | 307/270 |

Primary Examiner—Stanley D. Miller
Assistant Examiner—B. P. Davis
Attorney, Agent, or Firm—Donald J. Singer; William Stepanishen

[57] ABSTRACT

A high voltage driver amplifier apparatus utilizing two high-voltage, current switches which are controlled by gated logic circuits, to connect a capacitive load to either a positive or negative high voltage power source.

9 Claims, 3 Drawing Figures

HIGH VOLTAGE DRIVER AMPLIFIER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a high voltage power supply system, and in particular to a driver amplifier apparatus for a high voltage power supply.

An electric switch is a device that makes, breaks, or changes the course of an electric circuit. Basically, an electric switch consists of two or more contacts mounted on an insulating structure and arranged so that they can be moved into and out of contact with each other by a suitable operating mechanism.

The term switch is usually used to denote only those devices intended to function when the circuit is energized or deenergized under normal operating conditions; as contrasted with circuit breakers, which have as one of their primary functions the interruption of short circuit currents. Although there are hundreds of types of electric switches their application can be broadly classified into two major categories; power and signal.

In a power application, the function of a switch is to energize or deenergize an electric load. On the low end of the power scale, wallswitches are used in homes and offices for turning lights on and off; dial and push button switches control power to electric ranges, washing machines and dishwashers. On the high end of the scale are load-break switches and disconnect switches in power systems at the highest voltage.

For power applications, when closed, switches are required to carry a certain amount of continuous current without overheating, and in the open position they must provide enough insulation to isolate the circuit electrically. The latter function is particularly important in high voltage circuits because it is the practice in the electrical industry to forbid people from working on electrical equipment unless it is isolated from the electrical supply system by a visible break in air. The present invention provides a means of connecting a high voltage source to a load.

SUMMARY OF THE INVENTION

The present invention utilizes a pair of high voltage, current switches to connect a capacitive load to either a positive or negative high voltage. A gated logic circuit is utilized to control the state of the two high-voltage, current switches. Control signals are applied to a positive and a negative comparator which respectively control a gated oscillator driver. Each gated oscillator driver respectively controls a high-voltage current switch. A timing circuit is utilized in each gated oscillator driver to automatically lower the driver frequency if the comparator output lasts longer than a predetermined time. The high-voltage current switches comprise stacks of lower voltage switching transistors which are arranged in series to withstand the applied high voltage to the load.

It is one object of the present invention, therefore, to provide an improved high voltage driver amplifier apparatus.

It is another object of the invention to provide an improved high voltage driver amplifier apparatus wherein two pulsed current sources are utilized to charge a capacitive load to a desired polarity and amplitude.

It is another object of the invention to provide an improved high voltage driver amplifier apparatus utilizing a pair of high voltage current switches to connect either a positive or negative high voltage to a load.

It is still another object of the invention to provide an improved high voltage driver amplifier apparatus utilizing a series stack of lower voltage transisters to provide a high voltage current switch.

These and other advantages, objects and features of the invention will become more apparent from the following description taken in conjunction with the illustrative embodiment in the accompanying drawings.

DESCRIPTION OF THE PREFERRED EMBODIMENT

Figure 1:
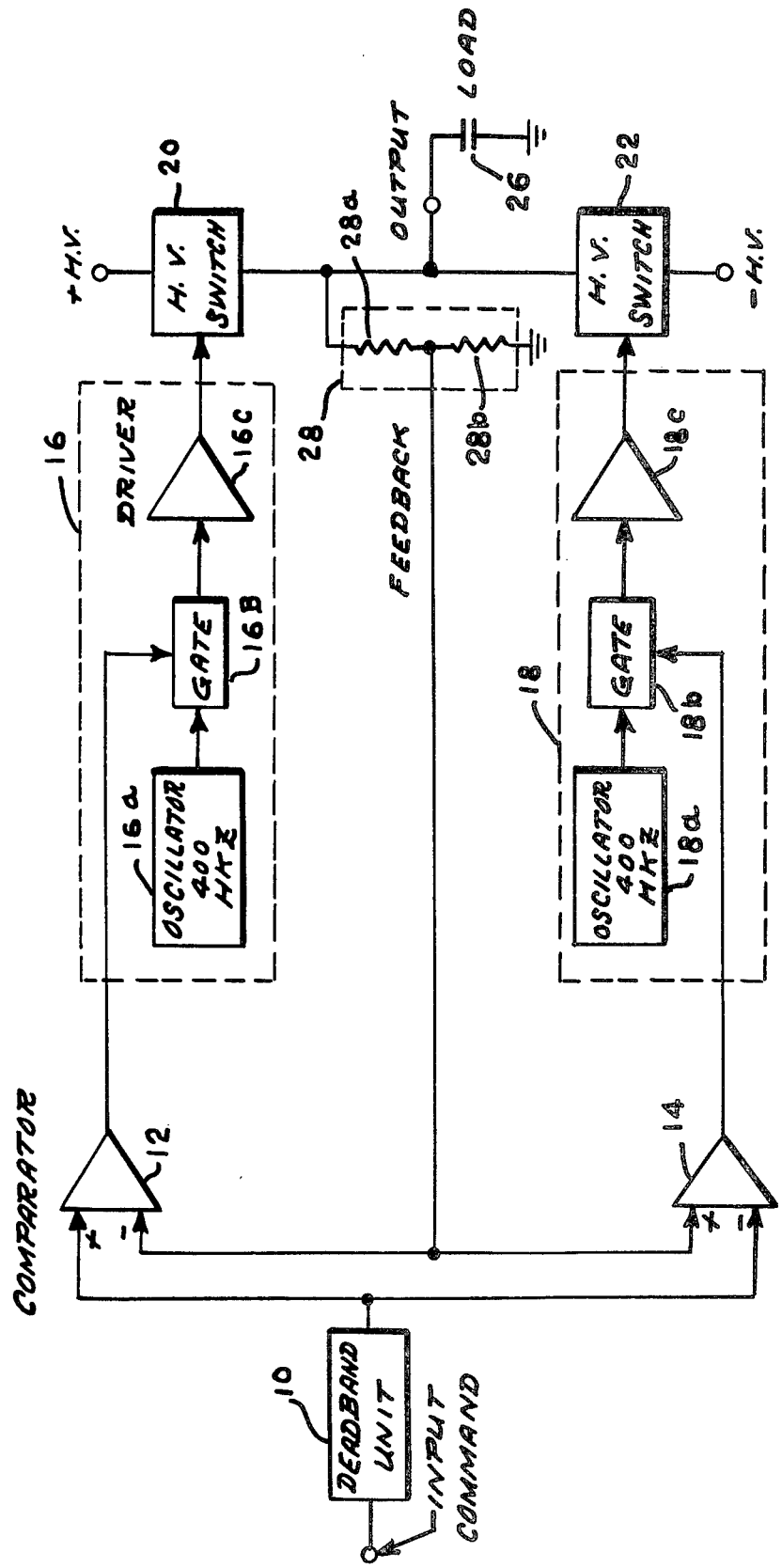
FIG. 1 is a block diagram of the high voltage driver apparatus in accordance with the present invention.

Referring now to FIG. 1, there is shown a high voltage driver amplifier apparatus receiving an input command signal at the input to the deadband unit 10. The deadband unit 10 provides a deadband of 50 to 100 volts between the input stages of the positive comparator 12 and the negative comparator 14 to provide overload protection between the positive and negative high voltage current switches. The output from the deadband unit 10 is connected respectively to the positive input of the positive comparator unit 12 and to the negative input of the negative comparator unit 14. The output from the positive comparator unit 12 is connected to a gated oscillator unit 16. The gate oscillator unit 16 comprises an oscillator unit 16a which provides a frequency output of 400 KHz, a gate unit 16b which receives the output from the comparator unit 12, and a driver amplifier unit 16c. The output from the driver amplifier unit 16c is connected to a high voltage switch unit 20 which receives a source of positive high voltage and is connected to a load source 26.

The negative comparator unit 14 is connected to a negative gated oscillator unit 18. The negative gated oscillator unit 18 comprises an oscillator unit 18a which provides a frequency signal of 400 HKz, a gate unit 18b which receives the output from the negative comparator unit 14, and a driver amplifier unit 18c. The output from the driver amplifier unit 18c is connected to a high voltage switch unit 22 which receives a source of negative high voltage and is connected to the load source 26. A feedback network 28 is connected from the outputs of the high voltage switch units 20, 22 and the load source 26 to ground. The feedback network 28 provides a feedback signal respectively to the negative input of the positive comparator unit 12 and to the positive input of the negative comparator unit 14. The feedback network 28 comprises a pair of resistors 28a, 28b which are arranged in series with the feedback signal being obtained at the junction of the resistor 28a, 28b.

The operational principle of the driver amplifier apparatus is to use two output current sources to charge the capacitive load to the desired polarity and amplitude, one for positive drive and one for negative drive. The oscillators that drive the pulsed current sources are controlled by comparators that turn the appropriate oscillator on when the output voltage is different from that requested by the input signal and off when it approaches the desired value. The comparators have a deadband that is slightly larger than the voltage produced by a single drive pulse, thus eliminating any possible oscillation between the positive and negative current sources. In the event of a failure that prevents the amplifier from reaching its commanded output voltage within three milliseconds, a timing circuit lowers the oscillator frequency by a factor of about 1/20 to prevent excessive power dissipation. The timer resets whenever the output reaches the currently commanded value.

Figure 2:
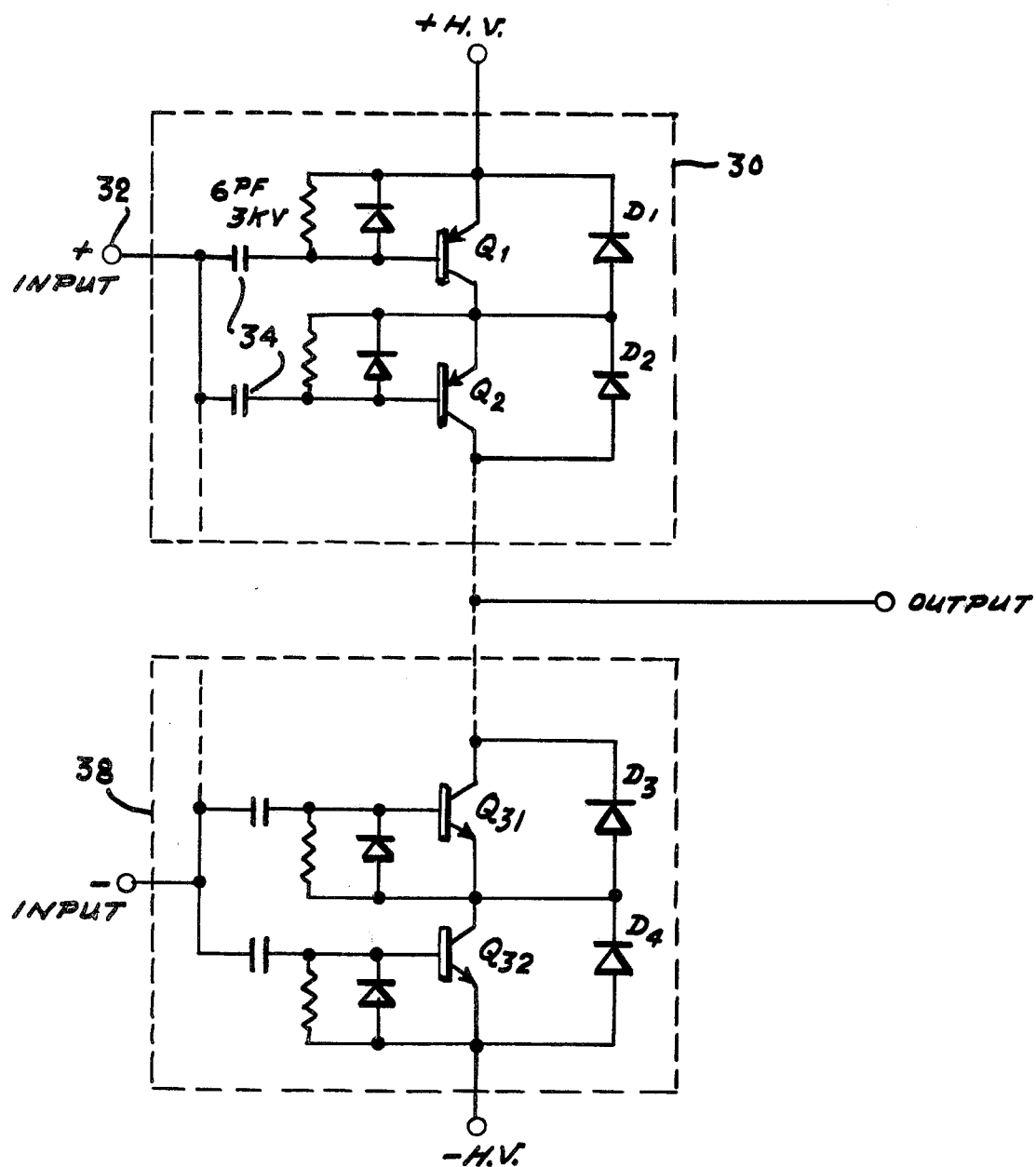
FIG. 2 is a schematic diagram of the high voltage current switch, and, FIG. 3 is a schematic diagram of the high voltage driver amplifier apparatus.

Turning now to FIG. 2, there is shown a schematic diagram of the high voltage current switch unit. The positive high voltage current unit 30 receives a driver amplifier signal at its input 32 which is connected through capacitors to the bases of a series stack of transistors. Transistors Q1, Q2 are two transistors in the stack of thirty transistors (not shown) which comprise the complete high voltage current switch unit 30. Each transistor of the stack of thirty is connected by a 6 pf coupling capacitor 34 to the input 32. Each transistor of the series stack of transistors Q1, Q2 . . . Qn, wherein n in this example is 29, has a diode D1, D2 . . . Dn connected between the emitter and collector of the respective transistor to provide an avalanche diode protection of 200 volts each. The negative high voltage current switch unit 38 is a series stack of thirty transistors which are arranged in the same configuration as the positive high voltage current supply switch unit 30 except that the transistors Q31, Q32 . . . Qn, wherein n in this example is 60, are NPN transistors rather than PNP transistors.

Figure 3:
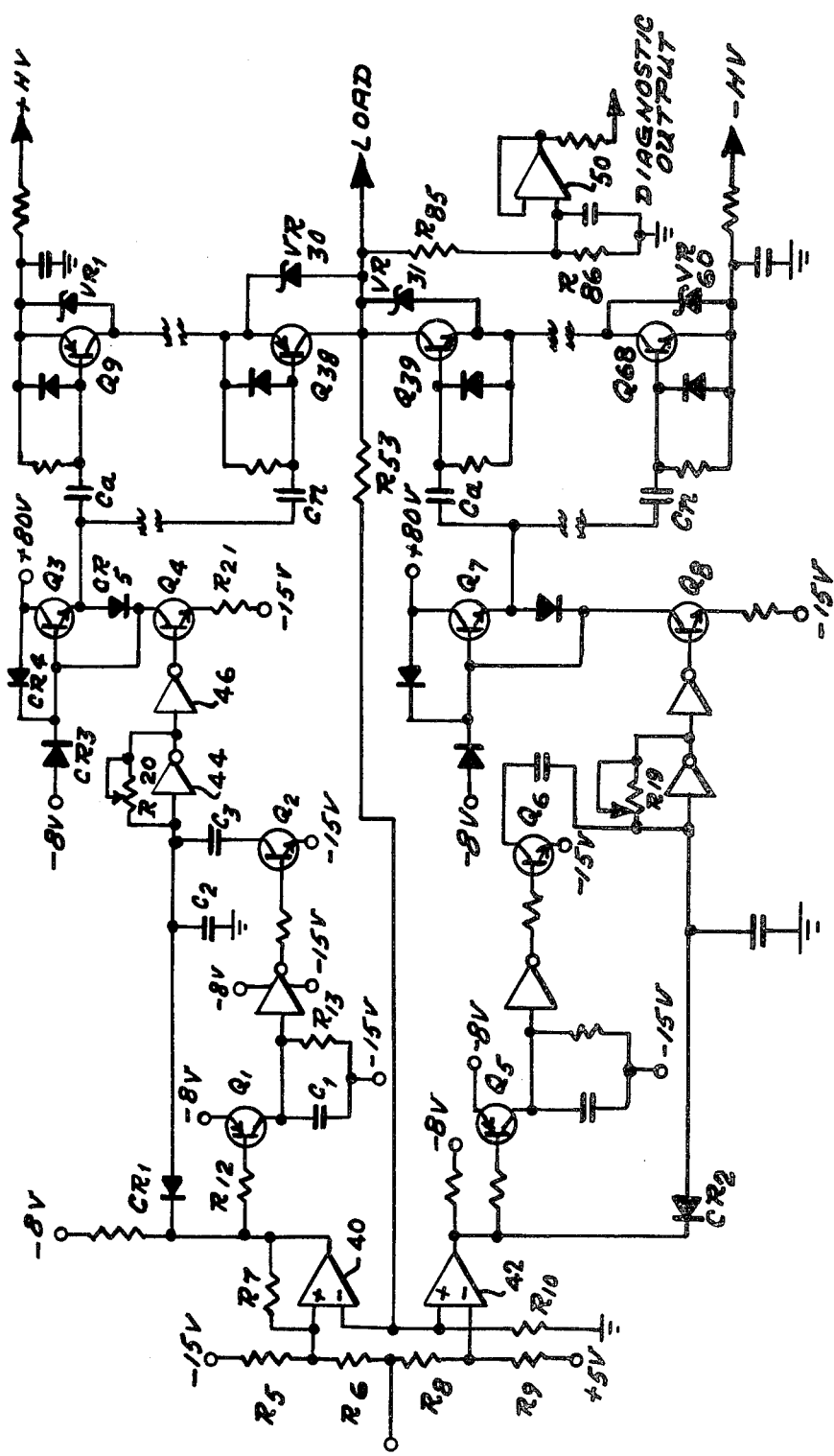

In FIG. 3 there is shown a schematic diagram of the high voltage driver amplifier apparatus utilizing a deadband circuit to receive the input signal. The deadband circuit comprises a series resistor network of resistors R5, R6, R8 and R9 connected between −15 volts and +5 volts. The input signal is applied at the junction of resistors R6 and R8. The input signal to the positive input terminal of the positive comparator unit 40 is obtained from the junction of resistors R5 and R6. The input signal to the negative input terminal of the negative comparator unit 42 is obtained from the junction of resistors R8 and R9. Each amplifier has a differential input to reduce pickup and ground noise. The upper half of the schematic contains the circuit of the positive (pull-up) switch and the lower half contain the circuit of the negative (pull-down) switch.

The pull-up and the pull-down sides of the circuit are identical, except for the output transistor types, and only the pull-up side will be explained. The current through resistors R5 and R6 provides a negative offset to the pull-up comparator command while resistors R8 and R9 provide a positive offset to the pull-down comparator command. This arrangement provides a deadband of constant total width. Resistor R7 provides a small amount of hysteresis that makes the comparator switching sharper.

The pull up comparator 40 has an open collector output with the emitter going to the −15 volt bus so that the output across resistor R11 swings from −8 to −15 volts. The pull-up off condition is with the comparator output low at −15 volts. The comparator 40 is connected to the oscillator 44 through the diode CR1.

A six-section CMOS Schmitt trigger integrated circuit type 74C13 may be utilized in part to provide the oscillator 44. The oscillator 44 is a section of IC 74C13 with 50 kohm variable feedback resistor R20 around it. The combination of the Schmitt trigger input inverter, the direct current feedback through the 50 kohm variable resistor R19 and the input loading capacitor C2 makes a square wave oscillator with a nominal operating frequency of 500 KHz. The oscillator 44 on the pull-up side is normally set to a higher frequency than that on the pull-down side to get equal output slew rates. Diode CR1 gates the oscillator 44 off by holding its input below its upper threshold when the comparator output is low.

The schematic path from resistor R12 to capacitor C3 is the timer and switch circuitry to lower the oscillator frequency if the comparator output remains high for more than three milliseconds. This will only occur under fault conditions as the maximum time required to swing from −2600 to +2600 volts (or vice versa) is normally less than one millisecond. The low oscillator frequency (nominal 10 KHz) drastically lowers the available pull up current to prevent excess power dissipation in the amplifier. Whenever the comparator 40 is off, the output goes low and capacitor C1 is charged through transistor Q1. Under these conditions, capacitor C1 is charged to at least −9.98 volts, the worst case upper threshold of the Schmitt trigger. When the comparator is on, the output is high and transistor Q1 is turned off and resistor R13 discharges capacitor C1. If the comparator output stays high long enough for the voltage across capacitor C1 to decay to the Schmitt lower threshold, transistor Q2 will be turned on thus connecting the low frequency capacitor C3, to lower the oscillator frequency.

The inverter 46 after the oscillator acts as a buffer and provides the desired polarity to cut transistor Q4 off when the pull-up side is off. Transistors Q3 and Q4 are the driver stages for the output transistor stacks. The constant current operation of the drivers changes the square waves from the oscillator into triangular waves to be differentiated by the 6 pf capacitors Ca–Cn to give a nominally square current pulse to the bases of the switching transistors Q9 through Q38. Resistor R21 sets the driver pull-down current and a constant current diode CR4 sets the driver pull-up current. Diode CR5 acts as a switch to disable transistor Q3, if transistor Q4 is operating diode CR 3 is a catch diode to prevent saturation of transistor Q4.

The positive side of the high voltage switch is a stack of 30 PNP transistors (NPN for the negative side) which are all switched on in parallel by current pulses through the 6 pf coupling capacitors. The supply voltage is 2700 volts, which is 100 volts more than the maximum output required, to allow for voltage drop across the switching stack. The use of a stack of low-voltage transistors rather than a small number of high-voltage transistors permits a lower power dissipation since the leakage current of presently available high-voltage transistors is rather high, thus producing a considerable standing power dissipation. The transistor stack has been designed with some redundancy to withstand the failure of up to three transistors without affecting overall performances. If four or more transistors should fail, then the output voltage capability would be reduced, but no catastrophic failure will result.

The maximum voltage that can appear across any transistor in the output stack is 200 plus or minus 10 percent volts, as limited by the UZ8220 zener diodes, VR1 through VR60. The transistors themselves are rated at 300 volts but a 200 volt operating point provides better reliability, lower leakage, and higher pulsed current capability. The base to emitter diodes and resistors control the leakage current effect, prevent the 6 pf capacitors from charging and thus keep the transistors turned off. Each 30 transistor stack will withstand the full plus to minus high voltage of 5400 volts. Resistors R53 and R10 form the amplifier high voltage feedback divider to the input voltage comparators. To make the diagnostic output relatively independent of the amplifier a separate high voltage divider (R85, R86) and a buffer amplifier 50 are used.

Although the invention has been described with reference to a particular embodiment, it will be understood to those skilled in the art that the invention is capable of a variety of alternative embodiments within the spirit and scope of the appended claims.

What is claimed is:

1. A high voltage driver amplifier apparatus comprising in combination:
    a deadband unit to receive an input signal, said deadband unit providing a deadband over a predetermined voltage range,
    a first comparator means having a positive input, a negative input and an output, said positive input connected to said deadband unit, said first comparator means receiving said input signal at said positive input, said first comparator means providing a comparator output signal,
    a first gated oscillator means connected to said first comparator means to receive said comparator output signal therefrom, said first gated oscillator means providing a clock pulse signal with a predetermined frequency,
    a first high voltage switch means receiving said clock pulse signal from said first gated oscillator means, said first high voltage switch means connected between a positive high voltage source and a load source, said first high voltage switch means applying said positive high voltage to said load source in response to said clock pulse signal,
    a second comparator means having a positive input, a negative input and an output, said negative input connected to said deadband unit, said second comparator means receiving said input signal at said negative input, said second comparator means providing a comparator output signal,
    a second gated oscillator means connected to said second comparator means to receive said comparator output signal therefrom, said second gated oscillator means providing a clock pulse signal with a predetermined frequency,
    a second high voltage switch means receiving said clock pulse signal from said second gated oscillator means, said second high voltage switch means connected between a negative high voltage source and said load source, said second high voltage switch means applying said negative high voltage to said load source in response to said clock pulse signal, and,
    a feedback network connected from between said first and second high voltage switch means, and said load source to ground, said feedback network providing a feedback signal, said feedback signal being applied to said negative input of said first comparator means and to said positive input of said second comparator means.

2. A high voltage driver amplifier apparatus as described in claim 1 wherein said deadband unit comprises a series circuit of four resistors, said input signal being applied to the center of said series circuit, the junction of the first and second resistors being connected to the positive input of said first comparator means and the junction of the third and fourth resistors being connected to the negative input of said second comparator means.

3. A high voltage driver amplifier apparatus as described in claim 1 wherein said first and second gated oscillator means each respectively comprise:
    an oscillator unit to generate a clock signal at a predetermined frequency,
    a logic gate means to receive said clock signal, said logic gate means receiving the comparator output signal and gating said clock signal through in response thereto, and,
    a driver amplifier means to receive said clock signal from said logic gate means, said driver amplifier means providing a driver output signal.

4. A high voltage driver amplifier apparatus as described in claim 1 wherein said first and second high voltage switch means each respectively comprise:
    a plurality of transistors which are arranged in a series configuration, each transistors of said plurality of transistors having a common input and receiving said clock pulse signal.

5. A high voltage driver amplifier apparatus as described in claim 1 wherein said clock pulse signal varies in frequency in response to said comparator output signal.

6. A high voltage driver amplifier apparatus as described in claim 1 wherein said load source is capacitive.

7. A high voltage driver amplifier apparatus as described in claim 1 wherein said predetermined voltage range of said deadband unit is a range of 50 to 100 volts.

8. A high voltage driver amplifier as described in claim 1 wherein said predetermined frequency of said clock pulse signal of said first and second oscillator means is 400 KHz.

9. A high voltage driver amplifier as described in claim 4 wherein said plurality of transistors comprise thirty low voltage transistors.

* * * * *